(12) United States Patent
Yoon et al.

(10) Patent No.: US 9,588,163 B2
(45) Date of Patent: Mar. 7, 2017

(54) APPARATUS AND METHOD FOR DETECTING FOREIGN OBJECT IN WIRELESS POWER TRANSMITTING SYSTEM

(71) Applicant: HANRIM POSTECH CO., LTD., Suwon-si, Gyeonggi-do (KR)

(72) Inventors: Yong Gu Yoon, Yongin-si (KR); Suk Woo Chung, Seoul (KR)

(73) Assignee: HANRIM POSTECH CO., LTD., Suwon-si, Gyeonggi-do (KR)

( * ) Notice: Subject to any disclaimer, the term of this patent is extended or adjusted under 35 U.S.C. 154(b) by 333 days.

(21) Appl. No.: 14/179,288

(22) Filed: Feb. 12, 2014

(65) Prior Publication Data

US 2014/0225628 A1  Aug. 14, 2014

(30) Foreign Application Priority Data

Feb. 14, 2013 (KR) .................. 10-2013-0016037

(51) Int. Cl.
*G01R 29/08* (2006.01)
*H02J 7/02* (2016.01)

(52) U.S. Cl.
CPC .......... *G01R 29/0814* (2013.01); *H02J 7/027* (2013.01)

(58) Field of Classification Search
CPC ..................... H02J 7/02; H02J 5/00
USPC ................... 324/654; 320/108–110
See application file for complete search history.

(56) References Cited

U.S. PATENT DOCUMENTS

2012/0242285 A1* 9/2012 Jung .................. H02J 7/0029
320/108

FOREIGN PATENT DOCUMENTS

| CN | 101971453 A | 2/2011 |
|---|---|---|
| CN | 102763306 A | 10/2012 |
| CN | 102782983 A | 11/2012 |
| JP | 3-9267 A | 1/1997 |
| JP | 2001309578 A | 11/2001 |
| JP | 2006-246633 A | 9/2006 |
| JP | 2010-220418 A | 9/2010 |
| JP | 2011-507481 A | 3/2011 |
| JP | 2011-81475 A | 4/2011 |
| JP | 2012-75200 A | 4/2012 |

(Continued)

OTHER PUBLICATIONS

Office Action issued by JPO on Apr. 7, 2015 for the corresponding JP Application No. 2014-025044.

(Continued)

*Primary Examiner* — Vincent Q Nguyen (74) *Attorney, Agent, or Firm* — Envision USA Inc.

(57) ABSTRACT

The present invention is related to an apparatus and method for detecting a foreign object in a wireless power transmitting system. Specifically, a wireless power transmitting apparatus includes a primary core block which transmits wireless power to a wireless power receiving apparatus through magnetic induction or magnetic resonance; an electric driving unit applying an AC (Alternating Current) signal required for the primary core block to transmit the wireless power; a control unit being connected to the electric driving unit and generating a control signal for controlling the AC signal; and a current measurement unit measuring a current flowing into the primary core block and obtaining a current measurement value converted to a numeric value relevant for the control unit to analyze the current.

19 Claims, 6 Drawing Sheets

(56) References Cited

FOREIGN PATENT DOCUMENTS

WO    WO 2009/014125 A1    1/2009
WO    WO 2011/118371 A1    9/2011

OTHER PUBLICATIONS

Chinese Office Action dated Sep. 2, 2015, issued to Chinese Application No. 201410050842.8.
Japanese Office Action issued by the Japanese Patent Office on Dec. 16, 2014, for the corresponding JP Application No. 2014-025044.

* cited by examiner

APPARATUS AND METHOD FOR DETECTING FOREIGN OBJECT IN WIRELESS POWER TRANSMITTING SYSTEM

CROSS-REFERENCE TO RELATED APPLICATIONS

This application claims the benefit of priority of Korean Application No. 10-2013-0016037, filed on Feb. 14, 2013 in the Korean Intellectual Property Office, the contents of which are incorporated by reference in their entirety herein.

BACKGROUND OF THE INVENTION

1. Field of the Invention

The present invention is related to wireless power transmission; more particularly, to an apparatus and method for detecting a foreign object in a wireless power transmitting system.

2. Description of the Related Art

In general, an external charger is used to charge portable terminals such as a mobile phone, notebook computer, or PDA by supplying electric energy or electric power thereto. Conventional portable terminals include battery cells storing supplied electric energy, and a circuit intended for charging and discharging the battery cells, thereby providing electric energy to the portable terminals.

The electrical interface between the charger and the battery cells, through which battery cells are charged with electric energy, may take the form of contacts. A contact-type electrical interface receives commercial electricity, transforms the electricity into voltage and currents relevant to the battery cells, and provides electric energy to the battery cells through the contacts of the corresponding battery cells.

Contacts of this kind require physical cables or use of electrical wires. Therefore, when a large number of terminals requiring the contact-type electric interface for energy are used, a large number of cables tend to occupy considerable workspace and may be unsightly or disorganized because it is not easy to arrange the cables properly. Moreover, the contact-type electrical interface may cause problems such as: instant discharge due to a potential difference between contacts, abrasion, risk of fire due to presence of flammable foreign objects, spontaneous discharge, decrease of battery lifetime, and degradation of battery performance.

Recently, to solve the aforementioned problems, charging systems employing wireless power transmission (hereinafter referred to as wireless power transmitting systems) and control methods for such systems have begun development. A wireless power transmitting method is also called a contactless power transmitting method or no point-of-contact power transmitting method. A wireless power transmitting system comprises a wireless power transmitting apparatus, which provides electric energy through wireless power transmission, and a wireless power receiving apparatus, which receives electric energy provided wirelessly from the wireless power transmitting apparatus and charges battery cells with the received electric energy.

Once connections are well secured between a charger and a mobile terminal, a contact-type electrical interface suffers little from obstacles disturbing battery charge, such as foreign objects. In contrast, because of the inherent characteristics of a wireless power transmitting system utilizing no-point-of-contact charge, there is a high chance that foreign objects could be inserted between the wireless power receiving apparatus and wireless power transmitting apparatus during charging. If a foreign object such as a metallic part is present between the wireless power receiving apparatus and wireless power transmitting apparatus, smooth power transmission is impaired due to the foreign object. Furthermore, problems such as damage and even detonation of the corresponding product due to overload and heating of the foreign object may result. Therefore, there is a need for an apparatus and method which detects foreign objects in a wireless power transmitting system.

SUMMARY OF THE INVENTION

An object of the present invention is to provide an apparatus and method which detects foreign objects in a wireless power transmitting system.

Another object of the present invention is to provide an apparatus and method which detects foreign objects based on a current induced in a primary coil of a wireless power transmitting system.

Yet another object of the present invention is to provide an apparatus and method which performs an operation in response to detection of foreign objects in a wireless power transmitting system.

Still another object of the present invention is to provide an apparatus and method of wireless power transmission equipped with a function which detects foreign objects in a wireless power transmission system.

According to one aspect of the present invention, a wireless power transmitting apparatus detecting foreign objects is provided. The apparatus comprises a primary core block coupled with a secondary core block installed in a wireless power receiving apparatus, where the primary core block transmits wireless power to the wireless power receiving apparatus through magnetic induction or magnetic resonance; an electric driving unit which applies an AC (alternating current) signal required for the primary core block to transmit the wireless power; a control unit connected to the electric driving unit which generates a control signal to control the AC signal; and a current measurement unit which measures a current flowing into the primary core block and obtaining a current measurement value converted to a numeric value relevant for the control unit to analyze the current.

The control unit may detect foreign objects coming between the wireless power transmitting apparatus and wireless power receiving apparatus by using a result of comparing the current measurement value with a reference value.

According to another aspect of the present invention, a method for detecting foreign objects by a wireless power transmitting apparatus equipped with a primary core block is provided. The method comprises applying an AC signal required for transmitting wireless power to the primary core block; transmitting the wireless power to a wireless power receiving apparatus, by coupling a secondary core block installed in the wireless power receiving apparatus with the primary core block through magnetic induction or magnetic resonance; obtaining a current measurement value by measuring a current flowing into the primary core block; and detecting one or more foreign objects located between the wireless power transmitting apparatus and the wireless power receiving apparatus, based on a result of comparing the current measurement value with a reference value.

Additional aspects and/or advantages of the invention will be set forth in part in the description which follows and, in part, will be obvious from the description, or may be learned by practice of the invention.

BRIEF DESCRIPTION OF THE DRAWINGS

The accompanying drawings, which are included to provide a further understanding of the present invention and constitute a part of specifications of the present invention, illustrate embodiments of the present invention and together with the corresponding descriptions serve to explain the principles of the present invention.

DETAILED DESCRIPTION OF THE EMBODIMENTS

Reference will now be made in detail to embodiments of the present invention, examples of which are illustrated in the accompanying drawings, wherein like reference numerals refer to the like elements throughout. The embodiments are described below in order to explain the present invention by referring to the figures.

The term "wireless power" is used to denote the energy of arbitrary shape related to electric fields, magnetic fields, and electromagnetic fields transmitted from a transmitter to a receiver without employing physical electromagnetic conductors. The wireless power may be called a power signal and may indicate an oscillating magnetic flux enclosed by a primary and secondary coil. For example, this document describes power transformation of a system intended to charge devices including but not limited to mobile phones, cordless phones, iPods, MP3 players, and headsets wirelessly. In general, basic principles of wireless transfer of energy rely on magnetic inductive coupling, magnetic resonance coupling (for instance, resonance induction) utilizing frequencies below 30 MHz, or both. For relatively high radiation levels, various frequencies below 135 kHz (LF) or above 13.56 MHz (HF), which include license-free frequencies, may be utilized.

Figure 1:
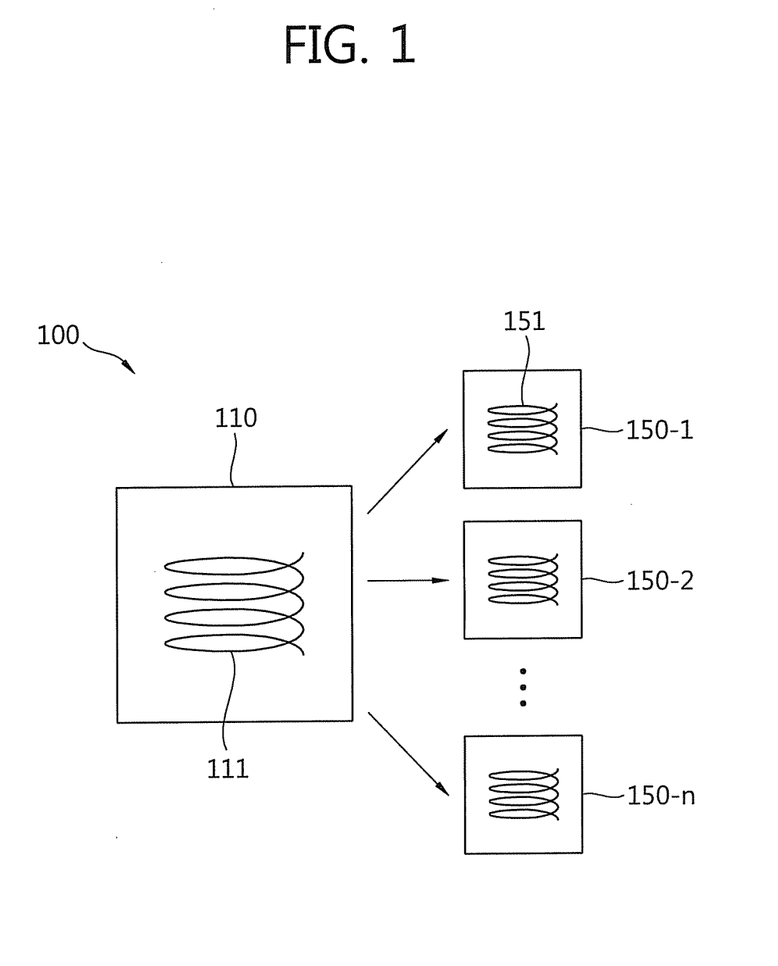
FIG. 1 is a block diagram illustrating constituting elements of a wireless power transmitting system according to one embodiment of the present invention.

FIG. 1 is a block diagram illustrating constituting elements of a wireless power transmitting system according to one embodiment of the present invention.

With reference to FIG. 1, a wireless power transmitting system 100 comprises a wireless power transmitting apparatus 110 and n wireless power receiving apparatuses 150-1, . . . , 150-n. Although a plurality of wireless power receiving apparatuses 150-1, . . . , 150-n are depicted, and will be referred to in reference to FIG. 1 for convenience, the invention is not so limited and may function with only one wireless power receiving apparatus 150-1, as will become clear.

The wireless power transmitting apparatus 110 includes a primary core block. The primary core block may comprise a core and one or more primary coils 111. The wireless power transmitting apparatus 110 may have an arbitrary shape. For example, the apparatus may take the shape of a flat platform with a power transmission surface; each wireless power receiving apparatus 150-1, . . . , 150-n may be disposed on or around the platform.

The wireless power receiving apparatuses 150-1, . . . , 150-n may be separated from the wireless power transmitting apparatus 110. Each of the wireless power receiving apparatus 150-1, . . . , 150-n is equipped with a secondary core block coupled with an electromagnetic field generated by the primary core block of the wireless power transmitting apparatus 110 in the vicinity thereof. Each secondary core block may comprise one or more secondary coils 151.

The wireless power transmitting apparatus 110 transmits power to the wireless power receiving apparatuses 150-1, . . . , 150-n without a direct electric contact. In this case, the primary core block and secondary core block are referred to as being coupled with each other through magnetic induction or resonance induction. The primary and secondary coil may assume an arbitrary shape relevant to each other; as one example, the coils may be in the form of copper wires wound along the periphery of a block made from a high permeability material such as ferrite or amorphous metal.

The wireless power receiving apparatuses 150-1, . . . , 150-n are connected to an external load (not shown) and provide power received wirelessly from the wireless power transmitting apparatus 110 to the external load. For example, the wireless power receiving apparatuses 150-1, . . . , 150-n may each convey the received power to an object which consumes or stores electric power, such as a portable electric or electronic device, rechargeable battery cell, or battery.

Figure 2:
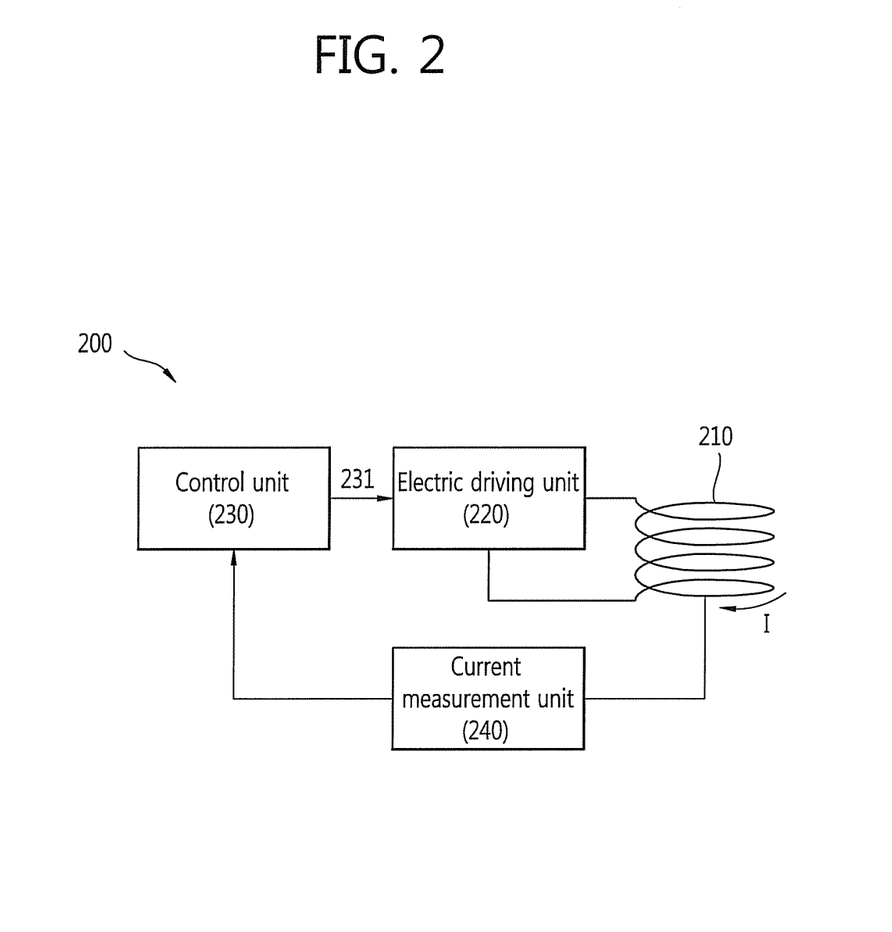
FIG. 2 is a block diagram illustrating a wireless power transmitting apparatus according to one embodiment of the present invention.

FIG. 2 is a block diagram illustrating a wireless power transmitting apparatus according to one embodiment of the present invention.

With reference to FIG. 2, a wireless power transmitting apparatus 200 comprises a primary coil 210, electric driving unit 220, control unit 230, and current measurement unit 240.

The electric driving unit 220 is connected to the primary coil 210 and may apply electric driving signals to the primary coil 210 to generate an electromagnetic field.

The control unit 230 is connected to the electric driving unit 220 and generates a control signal 231 which controls an AC signal needed for the primary coil 210 to generate an induced magnetic field or magnetic resonance.

The current measurement unit 240 measures a current flowing into the primary coil 210. In particular, the current measured by the current measurement unit 240 may be an alternating current. The current measurement unit 240 may comprise a current sensor. Also, the current measurement unit 240 may comprise a transformer used to scale down a high current flowing through the primary coil to a low current.

The current measurement unit 240 obtains a current measurement value $I_{measured}$ from the current flowing through the primary coil 210 and provides the obtained value to the control unit 230. The current measurement value $I_{measured}$ may have been converted to a DC value appropriate for the control unit 230 to recognize. In other words, the current measurement unit 240 measures a relatively high alternating current flowing through the primary coil 210, maps the measured high current into a current measurement value $I_{measured}$ appropriate for analysis by the control unit 230, and provides the current measurement value $I_{measured}$ to the control unit 230.

Hereinafter, operations that each constituting element of the wireless power transmitting apparatus 200 perform to detect a foreign object will be described in detail.

If the control unit 230 sends a control signal 231 corresponding to a reference AC signal to the electric driving unit 220, the electric driving unit 220 applies the reference AC signal to the primary coil 210. Here, the reference AC signal is an AC signal designed to make transmission efficiency of wireless power belong to a nominal range (or designed to satisfy the required electric power level of a receiving apparatus) in an environment free of foreign objects, namely in an environment not suffering from any obstacles against transmission of wireless power. This nominal range may vary depending on the specific configuration and needs of the system, and may be obtained experimentally. If the reference AC signal is applied to the primary coil 210, a reference current $I_{ref}$ flows through the primary coil 210, and a wireless power $W_{ref}$ is transmitted.

If a foreign object comes between the wireless power transmitting apparatus 200 and the wireless power receiving apparatus, the foreign object consumes an amount of power $W_{FO}$, and the wireless power receiving apparatus only receives the remaining power $W_{ref}$-$W_{FO}$. If the wireless power receiving apparatus fails to receive as much power as $W_{ref}$, the wireless power receiving apparatus may transmit a power increase request message to the wireless power transmitting apparatus 200 to request more power. On the other hand, if the wireless power receiving apparatus receives more power than $W_{ref}$, the wireless power receiving apparatus may transmit a power decrease request message to the wireless power transmitting apparatus 200. Both the power increase request message and the power decrease request message may be called control error packets.

The wireless power receiving apparatus may transmit the power increase request message or power decrease request message to the wireless power transmitting apparatus 200 continuously until the requested power is obtained. For example, the wireless power transmitting apparatus 200 which has received the power increase request message may increase intensity of the current flowing through the primary coil 210 in response to the message, so that higher power may be transmitted. More specifically, to make a larger current flow through the primary coil 210, the control unit 230 may adjust a control signal 231 so that an AC signal larger than the reference AC signal may be applied to the primary coil 210. Series of such processes are collectively called power control.

As a result of power control, the current measurement value $I_{measured}$ in the primary coil 210 may become larger than a predetermined range. If a current $I_{measured}$ larger than the reference current $I_{ref}$ is flowing through the primary coil 210 for transmission of required electric power, this indicates a drop of transmission efficiency of wireless power, and implies that a predetermined amount of electric power is continuously consumed due to a foreign object, in addition to the consumption of the wireless power receiving apparatus. Therefore, when a relatively large current flows in the primary coil 210, the control unit 230 decides that a foreign object exists in the transmission path of electric power. In other words, on the basis of the current measurement value $I_{measured}$, the control unit 230 may detect a foreign object, such as metal, which causes interference on transmission of wireless power.

To detect a foreign object, the control unit 230 may use one, or a combination of two or more, of the parameters such as current measurement value $I_{measured}$, reference current $I_{ref}$, reference range ($I_{low}$~$I_{high}$), reference AC signal, and foreign object detection time t. The parameters such as the reference current $I_{ref}$, reference range ($I_{low}$~$I_{high}$), reference AC signal, and foreign object detection time t may be stored in the control unit 230 as the initial setting values. The reference current $I_{ref}$ and reference range ($I_{low}$~$I_{high}$) may collectively be called reference values.

As one example, the control unit 230 compares the current measurement value $I_{measured}$ with the reference current $I_{ref}$. If the current measurement value $I_{measured}$ exceeds the reference current $I_{ref}$ (that is, if $I_{measured}$>$I_{ref}$), it is determined that a foreign object has been detected. On the other hand, if the current measurement value $I_{measured}$ is below the reference current $I_{ref}$ (that is, if $I_{measured}$≤$I_{ref}$), it is determined that no foreign object is detected. In one embodiment, the reference current $I_{ref}$ may be defined as follows according to the rated power W of the wireless power receiving apparatus.

TABLE 1

| Rx power (unit: W) | Tx AC current (unit: A) | Max AC current (unit: A) |
|---|---|---|
| 2.5 | 0.998 | 1.05 |
| 3 | 1.328 | 1.5 |
| 4 | 1.664 | 1.85 |
| 5 | 1.925 | 2.05 |

With reference to Table 1, when the rated power W of the wireless power receiving apparatus Rx is 2.5 W, 3 W, 4 W, or 5 W, the AC current flowing through the primary core block of the wireless power transmitting apparatus Tx is found experimentally to be 0.998 A, 1.328 A, 1.664 A, or 1.925 A, respectively. And the reference current allowed in the primary core block, namely the value of $I_{ref}$, is 1.05 A, 1.5 A, 1.85 A, or 2.05 A, respectively.

As another example, the control unit 230 examines whether the current measurement value $I_{measured}$ belongs to the reference range ($I_{low}$~$I_{high}$). If the current measurement value $I_{measured}$ belongs to the reference range (that is, if $I_{low}$≤$I_{measured}$≤$I_{high}$), it is determined that no foreign object is detected. On the other hand, if the current measurement value $I_{measured}$ is out of the reference range (that is, if $I_{measured}$>$I_{high}$ or $I_{measured}$<$I_{low}$), it is determined that a foreign object has been detected.

The control unit 230 may attempt to detect a foreign object at a time t. The time t may be predetermined by the system, or standard.

As one example, the time t at which the control unit 230 attempts detection of a foreign object may be a time point after each power control is complete. For example, the wireless power transmitting apparatus 200 may receive a power increase request message or power decrease request message from the wireless power receiving apparatus and increases or decreases the AC signal accordingly. Afterwards, the control unit 230 may attempt to detect a foreign object by using a current measurement value flowing through the primary coil 210.

As another example, the time t at which the control unit 230 attempts detection of a foreign object may correspond to a predetermined detection period. For example, it is preferable that the detection period should be shorter than the time period needed for a foreign object to develop heat above a predetermined temperature, because serious safety problems such as outbreak of fire or bodily burns may result from excessive heat. Other undesirable factors, including but not limited to overload, may also develop due to the presence of a foreign object within a roughly knowable period of time. Therefore, it is preferable to set the detection period to a value which has been verified by experiments as safe, and by doing so, various factors such as heat developed by a foreign object, which may be caused during wireless charging and lead to a dangerous situation, may be prevented.

When a foreign object is detected, the control unit 230 blocks or stops the wireless power transfer by controlling the electric driving unit 220 so that an AC signal is not applied to the primary coil 210.

Figure 3:
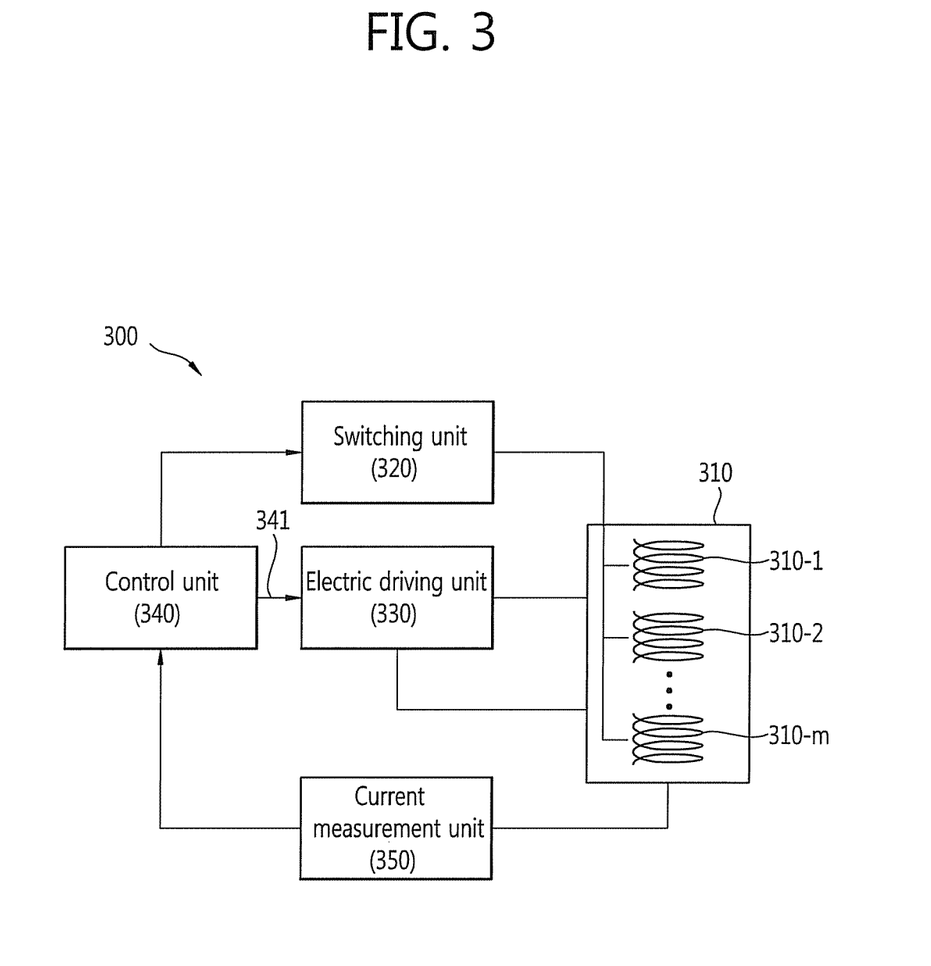
FIG. 3 is a block diagram illustrating a wireless power transmitting apparatus according to another embodiment of the present invention.

FIG. 3 is a block diagram illustrating a wireless power transmitting apparatus according to another embodiment of the present invention.

With reference to FIG. 3, a wireless power transmitting apparatus 300 comprises a primary core block 310 consisting of m primary coils 310-1, ..., 310-m, a switching unit 320, an electric driving unit 330, a control unit 340, and a current measurement unit 350.

The switching unit 320, by employing a switching method, connects all or at least one of the m primary coils 310-1, ..., 310-m selectively to the electric driving unit 330.

The electric driving unit 330 is connected to the m primary coils 310-1, ..., 310-m through the switching unit 320 and may apply electrical driving signals to n primary coils 310-1, ..., 310-n simultaneously, or to at least one primary coil selected from the n primary coils 310-1, ..., 310-n, to generate an electromagnetic field.

The control unit 340, being connected to the electric driving unit 330, generates a control signal 341 which controls an AC signal required for the n primary coils 310-1, ..., 310-n to generate an induced magnetic field or resonance.

The current measurement unit 350 measures currents flowing into the m primary coils 310-1, ..., 310-m individually or together. In particular, the current measured by the current measurement unit 350 may be an alternating current. The current measurement unit 350 may comprise a current sensor. Also, the current measurement unit 350 may comprise a transformer used to scale down a high current flowing through the primary coil to a low current.

As one example, the current measurement unit 350 selects only those primary coils through which currents flow from among the m primary coils 310-1, ..., 310-m, measures the current flowing through the selected primary coils respectively, obtains a plurality of individual current measurement values $I_1, I_2, \ldots, I_m$, and provides the measured values to the control unit 340. The current measurement values $I_1, I_2, \ldots, I_m$ may have been 'converted to DC values appropriate for the control unit 340 to recognize. In other words, the current measurement unit 350 measures relatively high alternating currents flowing through the primary coils 310-1, ..., 310-m, maps the measured high currents into current measurement values $I_1, I_2, \ldots, I_m$ appropriate for analysis by the control unit 340, and provides the current measurement values $I_1, I_2, \ldots, I_m$ to the control unit 340.

As another example, the current measurement unit 350 selects only those primary coils through which currents flow from among the m primary coils 310-1, ..., 310-m, measures the currents flowing through the whole of the selected primary coils, and inputs the single, whole current measurement value $I_{SELECTED}$ to the control unit 340.

As yet another example, the current measurement unit 350 measures a total amount of currents flowing through the m primary coils 310-1, ..., 310-m and provides the single, whole current measurement value $I_{TOTAL}$ to the control unit 340.

To detect a foreign object, the control unit 340 may use one, or a combination of two or more of the parameters, such as current measurement values $I_1, I_2, \ldots, I_m$ (or $I_{SELECTED}$ or $I_{TOTAL}$), reference current $I_{ref}$, reference range ($I_{low} \sim I_{high}$), reference AC signal, and foreign object detection time t. The parameters such as the reference current $I_{ref}$, reference range ($I_{low} \sim I_{high}$), reference AC signal, and foreign object detection time t may be stored in the control unit 340 as the initial setting values. The reference current $I_{ref}$ and reference range ($I_{low} \sim I_{high}$) may collectively be called reference values.

As one example, the control unit 340 compares the current measurement values $I_1, I_2, \ldots, I_m$ individually with the reference current $I_{ref}$. If at least one of the current measurement values $I_1, I_2, \ldots, I_m$ exceeds the reference current $I_{ref}$ (that is, if $I_1$ or $I_2$ or ... $I_m > I_{ref}$), it is determined that a foreign object has been detected. On the other hand, if all of the current measurement values $I_1, I_2, \ldots, I_m$ are below the reference current $I_{ref}$ (that is, if $I_1$ and $I_2$ and ... $I_m \leq I_{ref}$), it is determined that no foreign object is detected.

As another example, the control unit 340 examines whether each of the current measurement values $I_1, I_2, \ldots, I_m$ belongs to the reference range ($I_{low} \sim I_{high}$). If all of the current measurement values $I_1, I_2, \ldots, I_m$ belong to the reference range (that is, if $I_{low} \leq I_1$ and $I_2$ and ... $I_m \leq I_{high}$), it is determined that no foreign object is detected. On the other hand, if at least one of the current measurement values $I_1, I_2, \ldots, I_m$ does not belong to the reference range (that is, if one or more of $I_1$ and $I_2$ and ... $I_m > I_{high}$, or one or more of $I_1$ and $I_2$ and ... $I_m < I_{low}$), it is determined that a foreign object has been detected.

As yet another example, the control unit 340 compares a current measurement value $I_{SELECTED}$ with the reference current $I_{ref}$. If the current measurement value $I_{SELECTED}$ exceeds the reference current $I_{ref}$ (that is, if $I_{SELECTED} > I_{ref}$), it is determined that a foreign object has been detected. On the other hand, if the current measurement value $I_{SELECTED}$ is below the reference current $I_{ref}$ (that is, if $I_{SELECTED} \leq I_{ref}$), it is determined that no foreign object is detected.

As still another example, the control unit 340 examines whether the current measurement value $I_{SELECTED}$ belongs to the reference range ($I_{low} \sim I_{high}$). If the current measurement value $I_{SELECTED}$ belongs to the reference range (that is, if $I_{low} \leq I_{SELECTED} \leq I_{high}$), it is determined that no foreign object is detected. On the other hand, if the current measurement value $I_{SELECTED}$ does not belong to the reference range (that is, if $I_{SELECTED} > I_{high}$ or $I_{SELECTED} < I_{low}$), it is determined that a foreign object has been detected.

As a further example, the control unit 340 compares a current measurement value $I_{TOTAL}$ with the reference current $I_{ref}$. If the current measurement value $I_{TOTAL}$ exceeds the reference current $I_{ref}$ (that is, if $I_{TOTAL} > I_{ref}$), it is determined that a foreign object has been detected. On the other hand, if the current measurement value $I_{TOTAL}$ is below the reference current $I_{ref}$ (that is, if $I_{TOTAL} \leq I_{ref}$), it is determined that no foreign object is detected.

As an additional example, the control unit 340 examines whether the current measurement value $I_{TOTAL}$ belongs to the reference range ($I_{low} \sim I_{high}$). If the current measurement value $I_{TOTAL}$ belongs to the reference range (that is, if $I_{low} \leq I_{TOTAL} \leq I_{high}$), it is determined that no foreign object is detected. On the other hand, if the current measurement value $I_{TOTAL}$ does not belong to the reference range (that is, if $I_{TOTAL} > I_{high}$ or $I_{TOTAL} < I_{low}$), it is determined that a foreign object has been detected.

The control unit 340 may attempt to detect foreign objects at a time t. The time t may be predetermined by the system, or standard.

As one example, the time t at which the control unit 340 attempts to detect foreign objects may be a time point after each power control is complete. For example, the wireless power transmitting apparatus 300 may receive a power increase request message or power decrease request message from the wireless power receiving apparatus and increases or decreases the AC signal accordingly. Afterwards, the control unit 340 may attempt to detect a foreign object by using a measurement value of the current flowing through the primary core block 310.

As another example, the time t at which the control unit 340 attempts to detect foreign objects may be defined according to a predetermined detection period. For example, it is preferable that the detection period should be shorter than the time period required for a foreign object to develop heat above a predetermined temperature, because serious safety problems such as outbreak of fire or bodily burns may result from excessive heat. Other undesirable factors, including but not limited to overload, may also develop due to the presence of a foreign object within a roughly knowable period of time. Therefore, it is preferable to set the detection period to a value which has been verified by experiments as safe, and by doing so, various factors such as heat developed by a foreign object, which may be caused during wireless charging and lead to a dangerous situation, may be prevented.

When a foreign object is detected, the control unit 340 blocks or stops the wireless power transfer by controlling the electric driving unit 330 so that an AC signal is not applied to the primary coil 310.

The wireless power transmitting apparatus 110 of FIG. 1 may correspond to the wireless power transmitting apparatus 200 of FIG. 2 or wireless power transmitting apparatus 300 of FIG. 3.

According to an embodiment of the present invention, signaling overhead may be reduced since it is not necessary for the wireless power receiving apparatus to transmit particular information to the wireless power transmitting apparatus according to a predefined information transmission specification to detect a foreign object.

Detection of a foreign object with the least delay before the foreign object develops heat is a very important technical issue. This is so because if a foreign object readily develops heat by nature, a long delay before detecting the foreign object may cause a serious problem. Since the wireless power transmitting apparatus may detect a foreign object autonomously, however, the present invention provides an advantageous effect of obviating a delay consequent to detection of the foreign object, namely the time period for the wireless power receiving apparatus to generate particular information, the time period for the particular information to be transmitted to the wireless power transmitting apparatus, and the time period for the wireless power transmitting apparatus to decode and analyze the particular information.

Furthermore, even if the wireless power receiving apparatus is of a low version model unable to transmit the particular information, the wireless power transmitting system according to the present invention may still ensure compatibility with the low version model.

Figure 4:
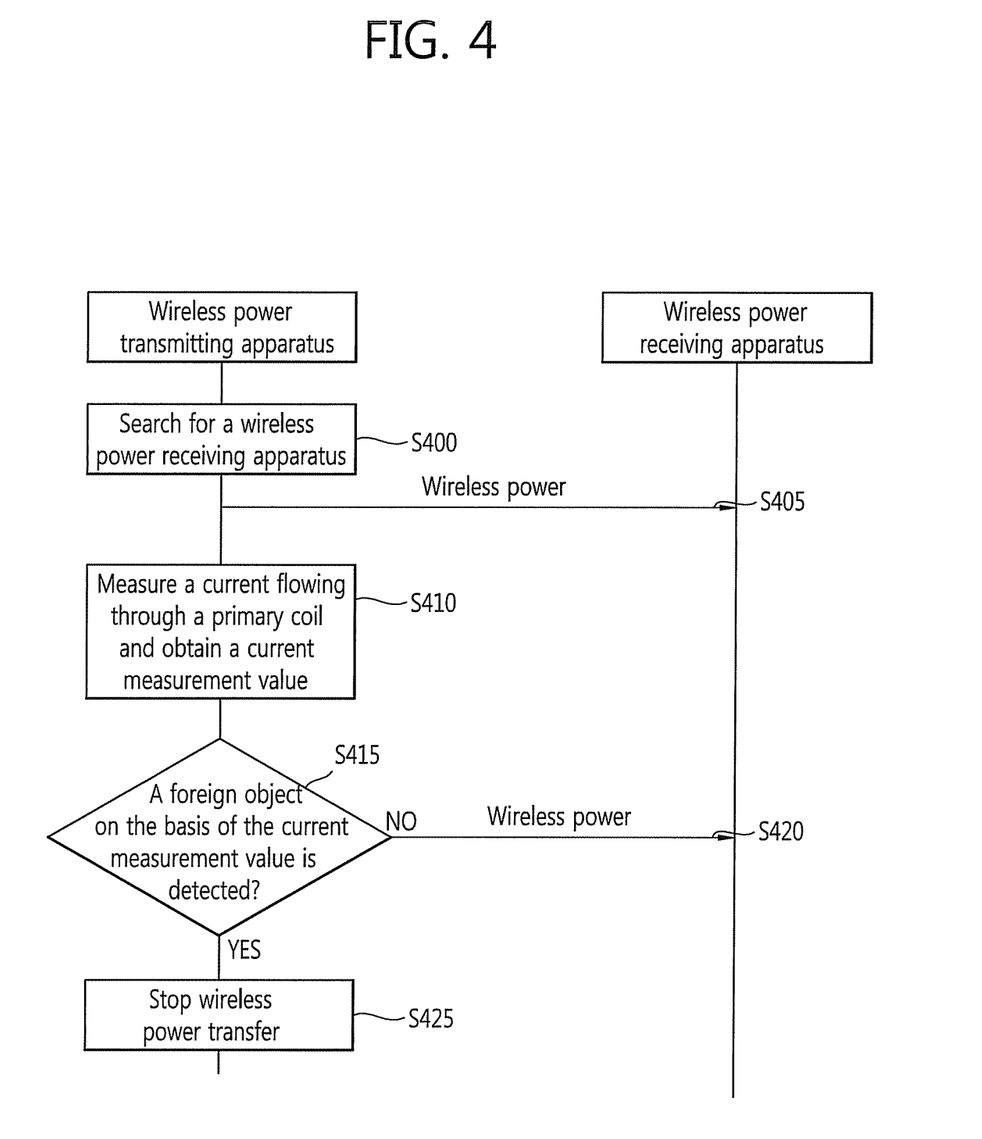
FIG. 4 is a flow diagram illustrating operation of a wireless power transmitting system according to one embodiment of the present invention.

FIG. 4 is a flow diagram illustrating operation of a wireless power transmitting system according to one embodiment of the present invention.

With reference to FIG. 4, the wireless power transmitting apparatus searches for a wireless power receiving apparatus S400. At this time, the wireless power transmitting apparatus is in a standby mode until a wireless power receiving apparatus is found.

If a detected object is a wireless power receiving apparatus, the wireless power transmitting apparatus enters a charging mode and transmits wireless power to the wireless power receiving apparatus S405. In the charging mode, the wireless power transmitting apparatus applies electric power to the primary coil and generates an induced magnetic field or resonance.

The wireless power transmitting apparatus measures a current flowing through the primary coil and obtains a current measurement value $I_{measured}$ from the current flowing through the primary coil S410. The current measured by the wireless power transmitting apparatus may be an alternating current. The current measurement value $I_{measured}$ may have been converted to a DC value appropriate for the control unit within the wireless power transmitting apparatus to recognize. In other words, the wireless power transmitting apparatus measures a relatively high alternating current flowing through the primary coil and maps the measured high current into a current measurement value appropriate for analysis by the control unit as shown in Table 1.

The wireless power transmitting apparatus uses one, or a combination of two or more, of the parameters such as current measurement value $I_{measured}$, reference current $I_{ref}$, reference range ($I_{low}$~$I_{high}$), reference AC signal, and foreign object detection time t to check if a foreign object is detected S415. The parameters such as the reference current $I_{ref}$, reference range ($I_{low}$~$I_{high}$), reference AC signal, and foreign object detection time t may be stored in the wireless power transmitting apparatus as the initial setting values.

The wireless power transmitting apparatus transmits power to the wireless power receiving apparatus continuously if a foreign object is not detected S420. Additionally, the wireless power transmitting apparatus again obtains a current measurement value of the primary coil at the time t predetermined by system or standard S410 and attempts to detect a foreign object on the basis of the obtained measurement value S415.

On the other hand, if a foreign object is detected, the wireless power transmitting apparatus blocks wireless power which is being transmitted to the wireless power receiving apparatus S425.

Figure 5:
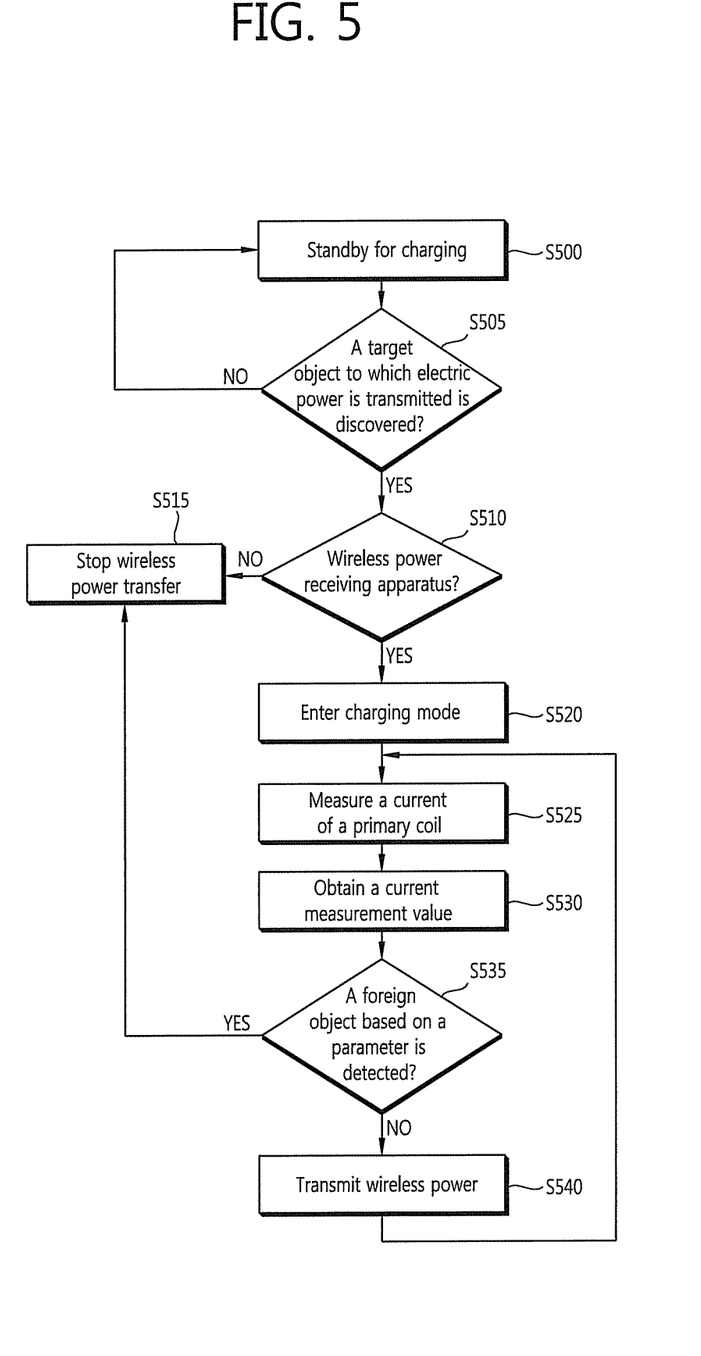
FIG. 5 is a flow diagram illustrating operation of a wireless power transmitting apparatus according to one embodiment of the present invention.

FIG. 5 is a flow diagram illustrating operation of a wireless power transmitting apparatus according to one embodiment of the present invention. The flow diagram of FIG. 5 illustrates a possible operation of the wireless power transmitting apparatus of FIG. 2.

With reference to FIG. 5, the wireless power transmitting apparatus is in a standby mode until a wireless power receiving apparatus is found S500.

At this time, the wireless power transmitting apparatus continuously searches for a target object to which electric power is transmitted S505. If no object is found, the wireless power transmitting apparatus returns to the standby mode S500.

If an object is discovered at S505, the wireless power transmission apparatus determines whether the discovered object is a wireless power receiving apparatus capable of receiving wireless power in a normal manner S510. In case the discovered object is not a wireless power receiving apparatus, the wireless power transmitting apparatus blocks or stops electric power transfer S515.

If the discovered object is a wireless power receiving apparatus, the wireless power transmitting apparatus enters a charging mode S520. In the charging mode, the wireless power transmitting apparatus generates an induced magnetic field or resonance by applying electric power to the primary coil.

The wireless power transmitting apparatus measures a current flowing through the primary coil S525. In particular, the current measured by the wireless power transmitting apparatus may be an alternating current.

The wireless power transmitting apparatus obtains a current measurement value $I_{measured}$ from the current flowing through the primary coil S530. The current measurement value $I_{measured}$ may have been converted to a DC value appropriate for the control unit within the wireless power transmitting apparatus to recognize. In other words, the wireless power transmitting apparatus measures a relatively high alternating current flowing through the primary coil and maps the measured high current into a current measurement value $I_{measured}$ appropriate for analysis.

The wireless power transmitting apparatus uses one, or a combination of two or more, of the parameters such as current measurement value $I_{measured}$, reference current $I_{ref}$, reference range ($I_{low}$~$I_{high}$), reference AC signal, and foreign object detection time t to check if a foreign object is detected S535. The parameters such as the reference current $I_{ref}$, reference range ($I_{low}$~$I_{high}$), reference AC signal, and foreign object detection time t may be stored in the wireless power transmitting apparatus as the initial setting values. The reference current $I_{ref}$ and reference range ($I_{low}$~$I_{high}$) may collectively be called reference values.

As one example, the wireless power transmitting apparatus compares the current measurement value $I_{measured}$ with the reference current $I_{ref}$. If the current measurement value $I_{measured}$ exceeds the reference current $I_{ref}$ (that is, if $I_{measured} > I_{ref}$), it is determined that a foreign object has been detected. On the other hand, if the current measurement value $I_{measured}$ is below the reference current $I_{ref}$ (that is, if $I_{measured} \leq I_{ref}$), it is determined that no foreign object is detected.

As another example, the wireless power transmitting apparatus examines whether the current measurement value $I_{measured}$ belongs to the reference range ($I_{low}$~$I_{high}$). If the current measurement value $I_{measured}$ belongs to the reference range (that is, if $I_{low}$~$I_{measured} \leq I_{high}$), the wireless power transmitting apparatus determines that no foreign object is detected. On the other hand, if the current measurement value $I_{measured}$ is out of the reference range (that is, if $I_{measured} > I_{high}$ or $I_{measured} < I_{low}$), the wireless power transmitting apparatus determines that a foreign object has been detected.

If a foreign object is detected at S535, the wireless power transmitting apparatus blocks or stops wireless power which is being transmitted to the wireless power receiving apparatus S515.

On the other hand, if a foreign object is not detected at S535, the wireless power transmitting apparatus transmits power to the wireless power receiving apparatus continuously S540. And the wireless power transmitting apparatus again measures a current of the primary coil at the time t predetermined by the system or standard S525, obtains a current measurement value S530, and attempts to detect a foreign object on the basis of the obtained measurement value S535.

As one example, the time t at which the wireless power transmitting apparatus attempts to detect foreign objects may be a time point after each power control is complete. For example, the wireless power transmitting apparatus may receive a power increase request message or power decrease request message from the wireless power receiving apparatus and increases or decreases an AC signal accordingly. Afterwards, the wireless power transmitting apparatus may attempt to detect a foreign object by using a measurement value of the current flowing through the primary core block.

As another example, the time t at which the wireless power transmitting apparatus attempts detection of a foreign object may correspond to a predetermined detection period. For example, it is preferable that the detection period should be shorter than the time period needed for a foreign object to develop heat above a predetermined temperature, because serious safety problems such as outbreak of fire or bodily burns may result from excessive heat. Other undesirable factors, including but not limited to overload, may also develop due to the presence of a foreign object within a roughly knowable period of time. Therefore, it is preferable to set the detection period to a value which has been verified by experiments as safe, and by doing so, various factors such as heat developed by a foreign object, which may be caused during wireless charging and lead to a dangerous situation, may be prevented.

Figure 6:
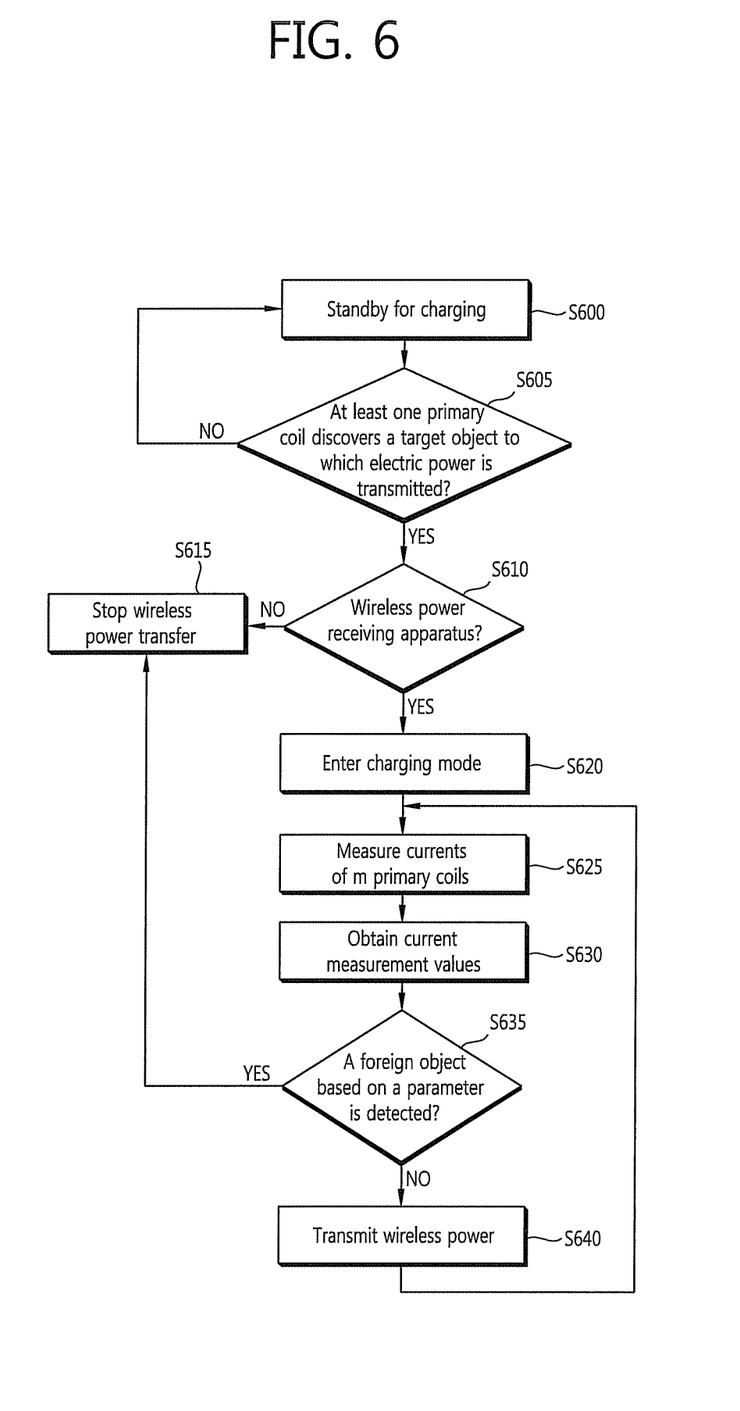
FIG. 6 is a flow diagram illustrating operation of a wireless power transmitting apparatus according to another embodiment of the present invention.

FIG. 6 is a flow diagram illustrating operation of a wireless power transmitting apparatus according to another embodiment of the present invention. The flow diagram of FIG. 5 illustrates a possible operation of the wireless power transmitting apparatus of FIG. 3.

With reference to FIG. 6, the wireless power transmitting apparatus is in a standby mode until a wireless power receiving apparatus is found S600.

At this time, the wireless power transmitting apparatus continuously searches for a target object to which electric power is transmitted by using m primary coils S605. If no object is found through at least one of the m primary coils, the wireless power transmitting apparatus returns to the standby mode S600.

If an object is discovered through at least one primary coil at S605, the wireless power transmission apparatus determines whether the discovered object is a wireless power receiving apparatus capable of receiving wireless power in a normal manner S610. In case the discovered object is not a wireless power receiving apparatus, the wireless power transmitting apparatus blocks or stops electric power transfer S615.

If the discovered object is a wireless power receiving apparatus, the wireless power transmitting apparatus enters a charging mode S620. In the charging mode, the wireless power transmitting apparatus generates an induced magnetic field or resonance by applying electric power to the primary coil through which the wireless power receiving apparatus was detected.

The wireless power transmitting apparatus measures currents flowing through the m primary coil S625 individually or together. In particular, the current measured by the wireless power transmitting apparatus may be an alternating current.

The wireless power transmitting apparatus obtains one or more current measurement values S630. As one example, the wireless power transmitting apparatus selects only those primary coils through which currents flow from among the m primary coils, measures the current flowing through the selected primary coils respectively, and obtains a plurality of individual current measurement values $I_1, I_2, \ldots, I_m$. The current measurement values $I_1, I_2, \ldots, I_m$ may have been converted to DC values appropriate for the wireless power transmitting apparatus to recognize. In other words, the wireless power transmitting apparatus measures relatively high alternating currents flowing through the primary coils and maps the measured high currents into current measurement values $I_1, I_2, \ldots, I_m$.

As another example, the wireless power transmitting apparatus selects only those primary coils through which currents flow from among the m primary coils and obtains a current measurement value $I_{SELECTED}$ by measuring a current flowing through the whole of the selected primary coils.

As a yet another example, the wireless power transmitting apparatus measures a total amount of currents flowing through the m primary coils and obtains the single, whole current measurement value $I_{TOTAL}$ as a current measurement value.

The wireless power transmitting apparatus may use one, or a combination of two or more, of the parameters such as current measurement values $I_1, I_2, \ldots, I_m$ (or $I_{SELECTED}$ or $I_{TOTAL}$), reference current $I_{ref}$, reference range ($I_{low}$~$I_{high}$), reference AC signal, and foreign object detection time t to check if a foreign object is detected S635. The parameters such as the reference current $I_{ref}$, reference range ($I_{low}$~$I_{high}$), reference AC signal, and foreign object detection time t may be stored in the wireless power transmitting apparatus as the initial setting values. The reference current $I_{ref}$ and reference range ($I_{low}$~$I_{high}$) may collectively be called reference values.

As one example, the wireless power transmitting apparatus compares the current measurement values $I_1, I_2, \ldots, I_m$ individually with the reference current $I_{ref}$. If at least one of the current measurement values $I_1, I_2, \ldots, I_m$ exceeds the reference current $I_{ref}$ (that is, if $I_1$ or $I_2$ or $\ldots I_m > I_{ref}$), it is determined that a foreign object has been detected. On the other hand, if all of the current measurement values $I_1, I_2, \ldots, I_m$ are below the reference current $I_{ref}$ (that is, if $I_1$ and $I_2$ and $\ldots I_m \leq I_{ref}$), it is determined that no foreign object is detected.

As another example, the wireless power transmitting apparatus examines whether each of the current measurement values $I_1, I_2, \ldots, I_m$ belongs to the reference range ($I_{low}$~$I_{high}$). If all of the current measurement values $I_1, I_2, \ldots, I_m$ belong to the reference range (that is, if $I_{low} \leq I_1$ and $I_2$ and $\ldots I_m \leq I_{high}$), it is determined that no foreign object is detected. On the other hand, if at least one of the current measurement values $I_1, I_2, \ldots, I_m$ does not belong to the reference range (that is, if one or more of $I_1$ and $I_2$ and $\ldots I_m > I_{high}$ or one or more of $I_1$ and $I_2$ and $\ldots I_m < I_{low}$), it is determined that a foreign object has been detected.

As yet another example, the wireless power transmitting apparatus compares a current measurement value $I_{SELECTED}$ with the reference current $I_{ref}$. If the current measurement value $I_{SELECTED}$ exceeds the reference current $I_{ref}$ (that is, if $I_{SELECTED} > I_{ref}$), it is determined that a foreign object has been detected. On the other hand, if the current measurement value $I_{SELECTED}$ is below the reference current $I_{ref}$ (that is, if $I_{SELECTED} \leq I_{ref}$), it is determined that no foreign object is detected.

As still another example, the wireless power transmitting apparatus examines whether the current measurement value $I_{SELECTED}$ belongs to the reference range ($I_{low}$~$I_{high}$). If the current measurement value $I_{SELECTED}$ belongs to the reference range (that is, if $I_{low} \leq I_{SELECTED} \leq I_{high}$), it is determined that no foreign object is detected. On the other hand, if the current measurement value $I_{SELECTED}$ does not belong to the reference range (that is, if $I_{SELECTED} > I_{high}$ or $I_{SELECTED} <$ low), it is determined that a foreign object has been detected.

As a further example, the wireless power transmitting apparatus compares a current measurement value $I_{TOTAL}$ with the reference current $I_{ref}$. If the current measurement value $I_{TOTAL}$ exceeds the reference current $I_{ref}$ (that is, if $I_{TOTAL} > I_{ref}$), it is determined that a foreign object has been detected. On the other hand, if the current measurement value $I_{TOTAL}$ is below the reference current $I_{ref}$ (that is, if $I_{TOTAL} \leq I_{ref}$), it is determined that no foreign object is detected.

As an additional example, the wireless power transmitting apparatus examines whether the current measurement value $I_{TOTAL}$ belongs to the reference range ($I_{low}$~$I_{high}$). If the current measurement value $I_{TOTAL}$ belongs to the reference range (that is, if $I_{low} \leq I_{TOTAL} < I_{high}$), it is determined that no foreign object is detected. On the other hand, if the current measurement value $I_{TOTAL}$ does not belong to the reference range (that is, if $I_{TOTAL} > I_{high}$ or $I_{TOTAL} < I_{low}$), it is determined that a foreign object has been detected.

If a foreign object is detected at S635, the wireless power transmitting apparatus blocks or stops wireless power transfer by controlling AC signals not to be applied to the m primary core blocks S615. On the other hand, if a foreign object is not detected at S635, the wireless power transmitting apparatus transmits power to the wireless power receiving apparatus continuously S640. And the wireless power transmitting apparatus measures currents of the m primary coils again at the time t predetermined by system or standard S625, obtains current measurement values S630, and attempts to detect a foreign object on the basis of the obtained measurement values S635.

As one example, the time t at which the wireless power transmitting apparatus attempts detection of a foreign object may be a time point after each power control is complete. For example, the wireless power transmitting apparatus may receive a power increase request message or power decrease request message from the wireless power receiving apparatus and increases or decreases an AC signal accordingly. Afterwards, the wireless power transmitting apparatus may attempt detection of a foreign object by using a current measurement value flowing through the primary core block.

As another example, the time t at which the wireless power transmitting apparatus attempts detection of a foreign object may correspond to a predetermined detection period. For example, it is preferable that the detection period should be shorter than the time period needed for a foreign object to develop heat above a predetermined temperature, because serious safety problems such as outbreak of fire or bodily burns may result from excessive heat. Other undesirable factors, including but not limited to overload, may also develop due to the presence of a foreign object within a roughly knowable period of time. Therefore, it is preferable to set the detection period to a value which has been verified by experiments as safe, and by doing so, various factors such as heat developed by a foreign object, which may be caused during wireless charging and lead to a dangerous situation, may be prevented.

All of the aforementioned functions may be carried out by a processor such as a microprocessor, controller, microcontroller, and ASIC (Application Specific Integrated Circuit) controlled by software or program codes implemented to perform the functions. It should be noted that the design, development, and implementation of the codes would be understood clearly to those skilled in the art on the basis of the descriptions of the present invention.

Although the term "a foreign object" has been used throughout this specification, it will be understood that the same principles may be used to detect multiple foreign objects.

So far, the present invention has been described with reference to embodiments. It should be understood by those skilled in the art, however, that the present invention may be modified or changed in various ways without departing from the technical principles and scope. Therefore, the present invention is not limited to the embodiments above, but the present invention includes all of the embodiments belonging to the technical scope of the present invention defined by the appended claims.

A wireless power transmitting apparatus according to the present invention may autonomously recognize foreign objects coming between the wireless power transmitting apparatus and a wireless power receiving apparatus without support of the wireless power receiving apparatus. In case a foreign object is detected, the apparatus stops transmission of wireless power or lets the user to remove the foreign object, thereby preventing damage of the apparatus due to the foreign object.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A wireless power transmitting apparatus detecting a foreign object comprising:
   a primary core block coupled with a secondary core block equipped in a wireless power receiving apparatus through magnetic induction or magnetic resonance and configured for transmitting wireless power to the wireless power receiving apparatus by the magnetic induction or the magnetic resonance;
   an electric driver connected to the primary core block and configured for applying an alternating current (AC) signal required for the primary core block to transmit the wireless power;
   a controller connected to the electric driver and configured for generating a control signal for controlling the AC signal; and
   a current sensor configured for measuring an alternating current flowing into the primary core block,
   wherein the controller is configured to discover an object by using a primary coil included in the primary core block in a standby mode, to determine whether the object is the wireless power apparatus or not when the object is detected, to control the electric driver to apply the AC signal in a charging mode when it is determined that the object is the wireless power receiving apparatus, to obtain a current measurement value based on the measured alternating current by the current sensor, to determine that a foreign object is detected when the current measurement value exceeds a reference value, and to determine that no foreign object is detected when the current measurement value is below or equal to the reference value, and
   wherein the current measurement value is increased or decreased by power control of the wireless power transmitting apparatus according to a control error packet received from the wireless power receiving apparatus.

2. The apparatus of claim 1,
   wherein the reference value is a current flowing through the primary core block when the electric driver applies a reference AC signal, and
   wherein the reference AC signal makes a transmission efficiency of wireless power belong to a nominal range in an environment free of the one or more foreign objects.

3. The apparatus of claim 1, wherein the reference value is a predetermined reference current.

4. The apparatus of claim 1,
   wherein the reference value comprises a reference range,
   wherein, if the current measurement value belongs to the reference range, the controller determines that no foreign object is detected, and
   wherein, if the current measurement value does not belong to the reference range, the controller determines that the one or more foreign objects have been detected.

5. The apparatus of claim 1,
   wherein the primary core block comprises a plurality of primary coils, and
   wherein the wireless power transmitting apparatus further comprises a switch connecting at least one of the plurality of primary coils selectively to the electric driver by employing a switching method.

6. The apparatus of claim 5,
   wherein the current sensor measures the alternating current flowing through each of the plurality of primary coils,
   wherein the current measurement value is individually obtained based on the measured alternating current from each of the plurality of primary coils,
   wherein the controller determines that the one or more foreign objects is detected if at least one of a plurality of current measurement values exceeds the reference value, and
   wherein the controller determines that no foreign object is detected if all of the plurality of current measurement values are below or equal to the reference value.

7. The apparatus of claim 5,
   wherein the current sensor measures a total amount of currents flowing through the plurality of primary coils,
   wherein the current measurement value corresponds to the total amount of currents.

8. The method of claim 1, wherein the controller performs detection of the one or more foreign objects at a predetermined time t.

9. The apparatus of claim 8, wherein the predetermined time t is a time point after each of a series of power control actions is complete.

10. The apparatus of claim 8, wherein the predetermined time t is a predetermined period which is shorter than the time period needed for the one or more foreign objects to develop heat above a predetermined temperature.

11. A method for detecting a foreign object using a wireless power transmitting apparatus equipped with a primary core block, the method comprising:
   discovering an object by using a primary coil included in the primary core block in a standby mode;
   determining whether the object is a wireless power receiving apparatus or not if-when the object is detected;
   applying an alternating current (AC) signal required for transmitting wireless power to the primary core block in a charging mode when it is determined that the object is the wireless power receiving apparatus;
   transmitting the wireless power to the wireless power receiving apparatus by coupling a secondary core block equipped in the wireless power receiving apparatus with the primary core block through magnetic induction or magnetic resonance in the charging mode;

measuring an alternating current flowing into the primary core block by using a current sensor included in the wireless power transmitting apparatus in the charging mode;

obtaining a current measurement value based on a measured alternating current by the current sensor; and determining that a foreign object is detected when the current measurement value exceeds a reference value and determining no foreign object is detected when the current measurement value is below or equal to the reference value, wherein the current measurement value is increased or decreased by power control of the wireless power transmitting apparatus according to a control error packet received from the wireless power receiving apparatus.

12. The method of claim 11,
wherein the reference value is a current flowing through the primary core block when a reference AC signal is applied, and
wherein the reference AC signal makes transmission efficiency of wireless power belong to a nominal range in an environment free of the one or more foreign objects.

13. The method of claim 11, wherein the reference value is a predetermined reference current.

14. The method of claim 11,
wherein the reference value comprises a reference range,
wherein, if the current measurement value belongs to the reference range, it is determined that no foreign object is detected, and wherein, if the current measurement value does not belong to the reference range, it is determined that the one or more foreign objects has been detected.

15. The method of claim 11,
wherein the primary core block comprises a plurality of primary coils,
wherein the current measurement value is individually obtained based on the measured alternating current from each of the plurality of primary coils,
wherein it is determined that the foreign object is detected if at least one of a plurality of the current measurement values exceeds the reference value, and
wherein it is determined that no foreign object is detected if all of the plurality of current measurement values are below or equal to the reference value.

16. The method of claim 11,
wherein the primary core block comprises a plurality of primary coils, and
wherein the current measurement value corresponds to a total amount of currents flowing through the plurality of primary coils.

17. The method of claim 11, wherein detection of the one or more foreign objects is performed at a predetermined time t.

18. The method of claim 17, wherein the predetermined time t is a time point after each of a series of power control actions is complete.

19. The method of claim 17, wherein the predetermined time t is a predetermined period which is shorter than the time period needed for the one or more foreign objects to develop heat above a predetermined temperature.

* * * * *